(12) United States Patent
Pautsch et al.

(10) Patent No.: US 7,757,497 B1
(45) Date of Patent: Jul. 20, 2010

(54) METHOD AND APPARATUS FOR COOLING ELECTRONIC COMPONENTS (75) Inventors: Gregory W. Pautsch, Chippewa Falls, WI (US); Adam Pautsch, Madison, WI (US)

(73) Assignee: Cray Inc., Seattle, WA (US)

( * ) Notice: Subject to any disclaimer, the term of this patent is extended or adjusted under 35 U.S.C. 154(b) by 0 days.

(21) Appl. No.: 12/356,020

(22) Filed: Jan. 19, 2009

Related U.S. Application Data (62) Division of application No. 11/075,832, filed on Mar. 9, 2005, now Pat. No. 7,478,769.

(51) Int. Cl.
F25D 17/02 (2006.01)
F25D 31/00 (2006.01)
F25D 23/12 (2006.01)
B05B 17/04 (2006.01)
B05B 1/34 (2006.01)
B05B 1/14 (2006.01)
H05K 7/20 (2006.01)
F28D 15/00 (2006.01)

(52) U.S. Cl. ............ 62/64; 62/259.2; 239/11; 239/463; 239/555; 361/699; 165/104.33

(58) Field of Classification Search ........ 62/62, 62/64, 259.2, 304, 310; 239/1, 11, 13, 463, 239/468, 472, 486, 487, 518, 536, 548, 553.3, 239/555–558, 560, 561, 589, 590, 590.3, 239/596, 601; 361/688, 689, 699; 165/104.19, 165/104.33; 257/712, 714
See application file for complete search history.

(56) References Cited

U.S. PATENT DOCUMENTS

| | | |
|---|---|---|
| 3,881,701 A | 5/1975 | Schoenman et al. |
| RE28,577 E | 10/1975 | Schmidt |
| 4,380,786 A | 4/1983 | Kelly |
| 4,412,303 A | 10/1983 | Barnes et al. |
| 4,541,046 A | 9/1985 | Nagashima et al. |
| 4,733,348 A | 3/1988 | Hiraoka et al. |
| 4,771,391 A | 9/1988 | Blasbalg |
| 4,868,818 A | 9/1989 | Madan et al. |
| 4,888,679 A | 12/1989 | Fossum et al. |

(Continued)

FOREIGN PATENT DOCUMENTS

EP        0353819  A2    2/1990

(Continued)

OTHER PUBLICATIONS

"U.S. Appl. No. 10/643,574, Non-Final Office Action Mailed Aug. 7, 2007", 31 pgs.

(Continued)

Primary Examiner—Darren W Gorman
(74) Attorney, Agent, or Firm—Schwegman, Lundberg & Woessner, P.A.

(57) ABSTRACT

A spray cooling system includes a spray delivery device and a cooling liquid delivered to the spray delivery device. The spray delivery device includes one or more inlet apertures and one or more corresponding outlet apertures, at least one pair of inlet aperture and corresponding outlet aperture being positioned relative to each so as to form an asymmetric non-uniform density full-cone spray pattern.

14 Claims, 5 Drawing Sheets

U.S. PATENT DOCUMENTS

| | | | |
|---|---|---|---|
| 4,933,933 A | 6/1990 | Dally et al. |
| 4,989,131 A | 1/1991 | Stone |
| 5,008,882 A | 4/1991 | Peterson et al. |
| 5,031,211 A | 7/1991 | Nagai et al. |
| 5,036,459 A | 7/1991 | Den Haan et al. |
| 5,068,851 A | 11/1991 | Bruckert et al. |
| 5,072,883 A | 12/1991 | Vidusek |
| 5,105,424 A | 4/1992 | Flaig et al. |
| 5,157,692 A | 10/1992 | Horie et al. |
| 5,161,156 A | 11/1992 | Baum et al. |
| 5,170,482 A | 12/1992 | Shu et al. |
| 5,175,733 A | 12/1992 | Nugent |
| 5,197,130 A | 3/1993 | Chen et al. |
| 5,218,601 A | 6/1993 | Chujo et al. |
| 5,218,676 A | 6/1993 | Ben-ayed et al. |
| 5,220,804 A | 6/1993 | Tilton et al. |
| 5,239,545 A | 8/1993 | Buchholz |
| 5,247,635 A | 9/1993 | Kamiya |
| 5,247,691 A | 9/1993 | Sakai |
| 5,270,572 A | 12/1993 | Nakajima et al. |
| 5,276,899 A | 1/1994 | Neches |
| 5,280,474 A | 1/1994 | Nickolls et al. |
| 5,297,738 A | 3/1994 | Lehr et al. |
| 5,311,931 A | 5/1994 | Lee |
| 5,313,628 A | 5/1994 | Mendelsohn et al. |
| 5,313,645 A | 5/1994 | Rolfe |
| 5,331,631 A | 7/1994 | Teraslinna |
| 5,333,279 A | 7/1994 | Dunning |
| 5,341,504 A | 8/1994 | Mori et al. |
| 5,347,450 A | 9/1994 | Nugent |
| 5,353,283 A | 10/1994 | Tsuchiya |
| 5,365,228 A | 11/1994 | Childs et al. |
| 5,375,223 A | 12/1994 | Meyers et al. |
| 5,418,916 A | 5/1995 | Hall et al. |
| 5,430,850 A | 7/1995 | Papadopoulos et al. |
| 5,430,884 A | 7/1995 | Beard et al. |
| 5,434,995 A | 7/1995 | Oberlin et al. |
| 5,435,884 A | 7/1995 | Simmons et al. |
| 5,437,017 A | 7/1995 | Moore et al. |
| 5,440,547 A | 8/1995 | Easki et al. |
| 5,446,915 A | 8/1995 | Pierce |
| 5,456,596 A | 10/1995 | Gourdine |
| 5,472,143 A | 12/1995 | Bartels et al. |
| 5,497,480 A | 3/1996 | Hayes et al. |
| 5,517,497 A | 5/1996 | LeBoudec et al. |
| 5,530,933 A | 6/1996 | Frink et al. |
| 5,546,549 A | 8/1996 | Barrett et al. |
| 5,548,639 A | 8/1996 | Ogura et al. |
| 5,550,589 A | 8/1996 | Shiojiri et al. |
| 5,555,542 A | 9/1996 | Ogura et al. |
| 5,560,029 A | 9/1996 | Papadopoulos et al. |
| 5,640,524 A | 6/1997 | Beard et al. |
| 5,649,141 A | 7/1997 | Yamazaki |
| 5,684,977 A | 11/1997 | Van Loo et al. |
| 5,717,895 A | 2/1998 | Leedom et al. |
| 5,721,921 A | 2/1998 | Kessler et al. |
| 5,740,967 A | 4/1998 | Simmons et al. |
| 5,765,009 A | 6/1998 | Ishizaka |
| 5,768,103 A | 6/1998 | Kobrinetz et al. |
| 5,787,494 A | 7/1998 | Delano et al. |
| 5,796,980 A | 8/1998 | Bowles |
| 5,835,951 A | 11/1998 | McMahan |
| 5,836,520 A | 11/1998 | Bhandarkar et al. |
| 5,860,146 A | 1/1999 | Vishin et al. |
| 5,860,602 A | 1/1999 | Tilton et al. |
| 5,897,664 A | 4/1999 | Nesheim et al. |
| 5,943,211 A | 8/1999 | Havey et al. |
| 5,946,717 A | 8/1999 | Uchibori |
| 5,951,882 A | 9/1999 | Simmons et al. |
| 5,987,571 A | 11/1999 | Shibata et al. |
| 6,003,123 A | 12/1999 | Carter et al. |
| 6,014,728 A | 1/2000 | Baror |
| 6,016,969 A | 1/2000 | Tilton et al. |
| 6,088,701 A | 7/2000 | Whaley et al. |
| 6,101,590 A | 8/2000 | Hansen |
| 6,105,113 A | 8/2000 | Schimmel |
| 6,161,208 A | 12/2000 | Dutton et al. |
| 6,308,250 B1 | 10/2001 | Klausler |
| 6,308,316 B1 | 10/2001 | Hashimoto et al. |
| 6,317,819 B1 | 11/2001 | Morton |
| 6,339,813 B1 | 1/2002 | Smith et al. |
| 6,356,983 B1 | 3/2002 | Parks |
| 6,366,461 B1 | 4/2002 | Pautsch et al. |
| 6,430,649 B1 | 8/2002 | Chaudhry et al. |
| 6,484,521 B2 | 11/2002 | Patel et al. |
| 6,490,671 B1 | 12/2002 | Frank et al. |
| 6,496,902 B1 | 12/2002 | Faanes et al. |
| 6,496,925 B1 | 12/2002 | Rodgers et al. |
| 6,498,725 B2 | 12/2002 | Cole et al. |
| 6,519,685 B1 | 2/2003 | Chang |
| 6,591,345 B1 | 7/2003 | Seznec |
| 6,665,774 B2 | 12/2003 | Faanes et al. |
| 6,684,305 B1 | 1/2004 | Deneau |
| 6,782,468 B1 | 8/2004 | Nakazato |
| 6,816,960 B2 | 11/2004 | Koyanagi |
| 6,857,283 B2 | 2/2005 | Tilton et al. |
| 6,922,766 B2 | 7/2005 | Scott |
| 6,925,547 B2 | 8/2005 | Scott et al. |
| 6,931,510 B1 | 8/2005 | Damron |
| 6,952,346 B2 | 10/2005 | Tilton et al. |
| 6,976,155 B2 | 12/2005 | Drysdale et al. |
| 7,028,143 B2 | 4/2006 | Barlow et al. |
| 7,082,778 B2 | 8/2006 | Patel et al. |
| 7,159,414 B2 | 1/2007 | Tilton et al. |
| 7,334,110 B1 | 2/2008 | Faanes et al. |
| 7,366,873 B1 | 4/2008 | Kohn |
| 7,478,769 B1 | 1/2009 | Pautsch |
| 2002/0116600 A1 | 8/2002 | Smith et al. |
| 2002/0169938 A1 | 11/2002 | Scott et al. |
| 2002/0172199 A1 | 11/2002 | Scott et al. |
| 2003/0005380 A1 | 1/2003 | Nguyen et al. |
| 2003/0097531 A1 | 5/2003 | Arimilli et al. |
| 2003/0167383 A1 | 9/2003 | Gupta et al. |
| 2004/0044872 A1 | 3/2004 | Scott |
| 2004/0050545 A1 | 3/2004 | Tilton |
| 2004/0060313 A1* | 4/2004 | Tilton et al. ............ 62/259.2 |
| 2004/0162949 A1 | 8/2004 | Scott et al. |
| 2005/0044128 A1 | 2/2005 | Scott et al. |
| 2005/0044339 A1 | 2/2005 | Sheets |
| 2005/0044340 A1 | 2/2005 | Sheets et al. |
| 2006/0117765 A1* | 6/2006 | Bash et al. ............... 62/121 |
| 2007/0283127 A1 | 12/2007 | Kohn et al. |

FOREIGN PATENT DOCUMENTS

| | | |
|---|---|---|
| EP | 0473452 A2 | 3/1992 |
| EP | 0475282 A2 | 3/1992 |
| EP | 0501524 A2 | 9/1992 |
| EP | 0570729 A2 | 11/1993 |
| WO | WO-8701750 A1 | 3/1987 |
| WO | WO-8808652 A1 | 11/1988 |
| WO | WO-9516236 A1 | 6/1995 |
| WO | WO-9610283 A1 | 4/1996 |
| WO | WO-9632681 A1 | 10/1996 |

OTHER PUBLICATIONS

"U.S. Appl. No. 10/643,574, Advisory Action mailed May 21, 2007", 3 pgs.

"U.S. Appl. No. 10/643,574, Final Office Action mailed Mar. 5, 2007", 31 pgs.

"U.S. Appl. No. 10/643,574, Non-Final Office Action mailed Jan. 30, 2006", 33 pgs.

"U.S. Appl. No. 10/643,574, Non-Final Office Action mailed Jul. 28, 2006", 30 pgs.

"U.S. Appl. No. 10/643,574, Notice of Allowance mailed Dec. 5, 2007", NOAR, 5 pgs.

"U.S. Appl. No. 10/643,574, RCE and Response Under 37 C.F.R. 1.116 filed Jul. 12, 2007 to Final Office Action mailed Mar. 5, 2007", 19 pgs.

"U.S. Appl. No. 10/643,574, Response filed Nov. 28, 2006 to Non-Final Office Action mailed Jul. 28, 2006", 15 pgs.

"U.S. Appl. No. 10/643,574, Response filed Nov. 7, 2007 to Non-final Office Action mailed Aug. 7, 2007", 15 pgs.

"U.S. Appl. No. 10/643,574, Response filed May 1, 2006 to Non-Final Office Action mailed Jan. 30, 2006", 29 pgs.

"U.S. Appl. No. 10/643,574, Response filed May 4, 2007 to Final Office Action mailed Mar. 5, 2007", 15 pgs.

"U.S. Appl. No. 10/643,574, Response filed Jul. 12, 2007 to Advisory Action mailed Mar. 5, 2007", 16 pgs.

"U.S. Appl. No. 10/643,585, Non-Final Office Action mailed Sep. 26, 2005", 9 pgs.

"U.S. Appl. No. 10/643,585, Request for Continued Examination filed Sep. 14, 2006", 1 pg.

"U.S. Appl. No. 10/643,585, Advisory Action mailed Apr. 2, 2007", 3 pgs.

"U.S. Appl. No. 10/643,585, Advisory Action mailed Aug. 14, 2006", 3 pgs.

"U.S. Appl. No. 10/643,585, Final Office Action mailed Jan. 25, 2007", 17 pgs.

"U.S. Appl. No. 10/643,585, Final Office Action mailed Apr. 14, 2006", 13 pgs.

"U.S. Appl. No. 10/643,585, Non-Final Office Action mailed Oct. 23, 2006", 12 pgs.

"U.S. Appl. No. 10/643,585, Notice of Allowance mailed Apr. 8, 2008", 6 pgs.

"U.S. Appl. No. 10/643,585, Notice of Allowance mailed Jun. 11, 2007", 6 pgs.

"U.S. Appl. No. 10/643,585, Notice of Allowance mailed Dec. 11, 2007", 6 pgs.

"U.S. Appl. No. 10/643,585, PTO Response mailed Jul. 23, 2007 to Rule 312 Communication filed Jul. 18, 2007", 2 pgs.

"U.S. Appl. No. 10/643,585, Response filed Mar. 22, 2007 to Final Office Action mailed Jan. 25, 2007", 23 pgs.

"U.S. Appl. No. 10/643,585, Response filed Mar. 27, 2006 to Non-Final Office Action mailed Sep. 26, 2005", 7 pgs.

"U.S. Appl. No. 10/643,585, Response filed Apr. 23, 2007 to Advisory Action mailed Apr. 2, 2007", 15 pgs.

"U.S. Appl. No. 10/643,585, Response filed Aug. 3, 2006 to Final Office Action mailed Apr. 14, 2006", 9 pgs.

"U.S. Appl. No. 10/643,585, Response filed Dec. 4, 2006 to Non-Final Office Action mailed Oct. 23, 2006", 17 pgs.

"U.S. Appl. No. 10/643,586, Advisory Action mailed Jan. 18, 2007", 3 pgs.

"U.S. Appl. No. 10/643,586, Final Office Action mailed Oct. 19, 2006", 27 pgs.

"U.S. Appl. No. 10/643,586, Non-Final Office Action mailed Feb. 8, 2006", 21 pgs.

"U.S. Appl. No. 10/643,586, Non-Final Office Action mailed May 2, 2007", 36 pgs.

"U.S. Appl. No. 10/643,586, Notice of Allowance mailed Oct. 23, 2007", 5 pgs.

"U.S. Appl. No. 10/643,586, Response filed Jan. 5, 2007 to Final Office Action mailed Oct. 19, 2006", 22 pgs.

"U.S. Appl. No. 10/643,586, Response filed Feb. 16, 2007 to Advisory Action mailed Jan. 18, 2007", 18 pgs.

"U.S. Appl. No. 10/643,586, Response filed Aug. 1, 2006 to Non-Final Office Action mailed Feb. 8, 2006", 24 pgs.

"U.S. Appl. No. 10/643,586, Response filed Sep. 4, 2007 to Non-Final Office Action filed May 2, 2007", 18 pgs.

"U.S. Appl. No. 10/643,727, Non-Final Office Action mailed Feb. 16, 2006", 33 pgs.

"U.S. Appl. No. 10/643,727, Non-Final Office Action mailed Aug. 11, 2006", 29 pgs.

"U.S. Appl. No. 10/643,727, Notice of Allowance mailed Feb. 28, 2007", 5 pgs.

"U.S. Appl. No. 10/643,727, Notice of Allowance mailed Apr. 28, 2008", 5 pgs.

"U.S. Appl. No. 10/643,727, Notice of Allowance mailed Jul. 19, 2007", 5 pgs.

"U.S. Appl. No. 10/643,727, Notice of Allowance mailed Nov. 27, 2007", 5 pgs.

"U.S. Appl. No. 10/643,727, Response filed Jan. 11, 2007 to Non-Final Office Action mailed Aug. 11, 2006", 20 pgs.

"U.S. Appl. No. 10/643,727, Response filed Jun. 15, 2006 to Non-Final Office Action mailed Feb. 16, 2006", 21 pgs.

"U.S. Appl. No. 10/643,738, Response filed Jan. 16, 2006 non-final office action mailed Sep. 26, 2005", 13 pgs.

"U.S. Appl. No. 10/643,738, Response filed Jun. 19, 2006 non-final office action mailed Feb. 17, 2006", 10 pgs.

"U.S. Appl. No. 10/643,738, Advisory Action mailed Jul. 31, 2007", 3 pgs.

"U.S. Appl. No. 10/643,738, Final Office Action mailed Apr. 17, 2007", 12 pgs.

"U.S. Appl. No. 10/643,738, Non-Final Office Action mailed Nov. 1, 2007", 19 pgs.

"U.S. Appl. No. 10/643,738, Non-Final Office Action mailed Feb. 17, 2006", 9 PGS.

"U.S. Appl. No. 10/643,738, Non-Final Office Action mailed Sep. 26, 2005", 11 pgs.

"U.S. Appl. No. 10/643,738, Response filed Jul. 17, 2007 final office action mailed Apr. 17, 2007", 17 pgs.

"U.S. Appl. No. 10/643,741, Final Office Action mailed Sep. 11, 2007", 26 pgs.

"U.S. Appl. No. 10/643,741, Non-Final Office Action mailed Apr. 5, 2007", 19 pgs.

"U.S. Appl. No. 10/643,741, Notice of Allowance mailed Feb. 12, 2008", 3 pgs.

"U.S. Appl. No. 10/643,741, Notice of Allowance mailed Jun. 9, 2008", 9 pgs.

"U.S. Appl. No. 10/643,741, Response mailed Nov. 13, 2007 to Final Office Action mailed Sep. 11, 2007", 14 pgs.

"U.S. Appl. No. 10/643,741, Response filed Jun. 4, 2007 to Non-Final Office Action mailed Apr. 5, 2007", 16 pgs.

"U.S. Appl. No. 10/643,741, Supplemental Notice of Allowability mailed Mar. 25, 2008", 6 Pgs.

"U.S. Appl. No. 10/643,742, Non-Final Office Action mailed Apr. 9, 2008", 12 pgs.

"U.S. Appl. No. 10/643,742, Non-Final Office Action mailed Jun. 4, 2007", 13 pgs.

"U.S. Appl. No. 10/643,742, Notice of Allowance mailed Nov. 7, 2007", 7 pgs.

"U.S. Appl. No. 10/643,742, Response filed Oct. 11, 2007 to Non-Final Office Action mailed Jun. 4, 2007", 18 pgs.

"U.S. Appl. No. 10/643,754, Non-Final Office Action mailed Jul. 5, 2007", 23 pgs.

"U.S. Appl. No. 10/643,754, Response filed Mar. 26, 2008 to Final Office Action mailed Nov. 26, 2007 and Advisory Action mailed Feb. 8, 2008", 12 pgs.

"U.S. Appl. No. 10/643,754, Final Office Action mailed Sep. 14, 2006", 21 pgs.

"U.S. Appl. No. 10/643,754, Final Office Action mailed Nov. 26, 2007", 29 pgs.

"U.S. Appl. No. 10/643,754, Non-Final Office Action mailed Feb. 8, 2006", 16 pgs.

"U.S. Appl. No. 10/643,754, Non-Final Office Action mailed Jun. 25, 2008", 30 pgs.

"U.S. Appl. No. 10/643,754, Response filed Jan. 25, 2008 to Final Office Action mailed Nov. 26, 2007", 20 pgs.

"U.S. Appl. No. 10/643,754, Response filed Mar. 30, 2007 to Advisory Action mailed Nov. 22, 2006", 10 pgs.

"U.S. Appl. No. 10/643,754, Response filed Jul. 10, 2006 to Non-Final Office Action mailed Feb. 8, 2006", 12 pgs.

"U.S. Appl. No. 10/643,754, Response filed Oct. 9, 2007 to Non-Final Office Action mailed Jul. 5, 2007", 14 pgs.

"U.S. Appl. No. 10/643,754, Response filed Nov. 8, 2006 to Final Office Action mailed Sep. 14, 2006", 12 pgs.

"U.S. Appl. No. 10/643,758, Notice of Allowance mailed Jan. 7, 2008", 4 pgs.

"U.S. Appl. No. 10/643,758, Notice of Allowance mailed Jul. 19, 2007", 4 pgs.

"U.S. Appl. No. 10/643,758, Final Office Action mailed Feb. 6, 2007", 23 pgs.

"U.S. Appl. No. 10/643,758, Final Office Action mailed Mar. 10, 2006", 13 pgs.

"U.S. Appl. No. 10/643,758, Non-Final Office Action mailed Aug. 15, 2006", 15 pgs.

"U.S. Appl. No. 10/643,758, Non-Final Office Action mailed Oct. 30, 2005", 8 pgs.

"U.S. Appl. No. 10/643,758, Notice of Allowance mailed Jun. 16, 2008", 6 pgs.

"U.S. Appl. No. 10/643,758, Notice of Allowance mailed Oct. 19, 2007", 4 pgs.

"U.S. Appl. No. 10/643,758, Response filed Jan. 30, 2006 to Non-Final Office Action mailed Aug. 30, 2005", 9 pgs.

"U.S. Appl. No. 10/643,758, Response filed Apr. 17, 2007 to Final Office Action mailed Feb. 6, 2007", 25 pgs.

"U.S. Appl. No. 10/643,758, Response filed Jul. 10, 2006 to Final Office Action mailed Mar. 10, 2006", 9 pgs.

"U.S. Appl. No. 10/643,758, Response filed Dec. 14, 2006 to Non-Final Office Action mailed Aug. 15, 2006", 17 pgs.

"U.S. Appl. No. 10/643,738, Non-Final Office Action Mailed Nov. 1, 2007", OARN, 3 pgs.

"U.S. Appl. No. 11/075,832, Response filed Jul. 15, 2008 to Non-Final Office Action mailed Jan. 15, 2008", 9 pgs.

"U.S. Appl. No. 11/075,832, Non-Final Office Action mailed Jan. 15, 2008", 3 Pages.

"U.S. Appl. No. 11/075,832, Notice of Allowance mailed Sep. 12, 2008", 6 pgs.

"U.S. Appl. No. 11/075,832, Response filed Nov. 1, 2007 to Restriction Requirement mailed Oct. 1, 2007", 6 pgs.

"Cray Assembly Language (CAL) for Cray X1tm Systems Reference Manual", *Section 2.6, Memory Ordering*, http://docs.cray.com/books/S-2314-51/index.html, (Jun. 2003), 302 pgs.

"Deadlock-Free Routing Schemes on Multistage Interconnection Networks", *IBM Technical Disclosure Bulletin*, 35, (Dec. 1992), 232-233.

"ECPE 4504: Computer Organization Lecture 12: Computer Arithmetic", The Bradley Department of Electrical Engineering, (Oct. 17, 2000), 12 pgs.

"Msync—Synchronise Memory with Physical Storage", *The Single UNIX® Specification, Version 2: Msync, The Open Group*, http://www.opengroup.org/onlinepubs/007908799/xsh/msync.html, (1997), 3 pgs.

Abts, D, "So Many States, So Little Time: Verifying Memory Coherence in the Cray X1", *Parallel and Distributed Processing Symposium*, (Apr. 22, 2003), 11-20.

Adve, V. S., et al., "Performance Analysis of Mesh Interconnection Networks with Deterministic Routing", *Transactions on Parallel and Distributed Systems*, 5(5), (Mar. 1994), 225-246.

Bolding, Kevin, "Non-Uniformities Introduced by Virtual Channel Deadlock Prevention", *Technical Report 92-07-07, Department of Computer Science and Engineering, FR-35 University of Washington*; Seattle, WA 98195, (Jul. 21, 1992).

Bolla, R., "A Neural Strategy for Optimal Multiplexing of Circuit and Packet-Switched Traffic", *Proceedings, IEEE Global Telecommunications Conference*, (1992), 1324-1330.

Boura, Y. M., et al., "Efficient Fully Adaptive Wormhole Routing in n-dimensional Meshes", *Proceedings, International Conference on Distributed Computing Systems*, (Jun. 1994), 589-596.

Bundy, A., et al., "Turning Eureka Steps into Calculations in Automatic Program Synthesis", *Proceedings of UK IT 90*, (IEE Conf. Pub. 316) (DAI Research Paper 448), (1991), 221-226.

Carlile, Bradley R., "Algorithms and Design: The CRAY APP Shared-Memory System", *COMPCON Spring '93. Digest of Papers.*, (Feb. 22, 1993), 312-320.

Chen, Y., et al., "UTLB: A Mechanism for Address Translation on Network Interfaces", *Proceedings of the Eighth International Conference on Architectural Support for Programming Languages and Operating Systems (ASPLOS)*, (1998), 193-204.

Chien, A. A., et al., "Planar-Adaptive Routing: Low-Cost Adaptive Networks for Multiprocessors", *Proceedings 19th International. Symposium on Computer Architecture*, (May 1992), 268-277.

Cohoon, J., et al., "", *C++ Program Design*, McGraw-Hill Companies, Inc., 2nd Edition, (1999), 493.

Dally, W. J., et al., "Deadlock-Free Adaptive Routing in Multicomputer Networks Using Virtual Channels", *IEEE Transactions on Parallel and Distributed Systems*, 4(4), (Apr. 1993), 466-475.

Dally, W. J., "Virtual Channel Flow Control", *Proceedings, 17th International Symposium on Computer Architecture*, (May 1990), 60-68.

Dally, William, et al., "Deadlock-Free Message Routing in Multiprocessor Interconnection Networks", *IEEE Transactions on Computers*, C-36, (May 1987), 547-553.

Dally, William, "Performance Analysis of k-ary n-cube Interconnection Networks", *IEEE Transactions on Computers*, 39(6), (Jun. 1990), 775-785.

Duato, J., "A New Theory of Deadlock-Free Adaptive Routing in Wormhole Networks", *IEEE Transactions on Parallel and Distributed Systems*, 4(12), (Dec. 1993), 1320-1331.

Ernst, D., et al., "Cyclone: A Broadcast-Free Dynamic Instruction Scheduler with Selective Replay", *30th Annual International Symposium on Computer Architecture (ISCA-2003)*, (Jun. 2003), 10 pgs.

Faanes, G. J., et al., "Decoupled Vector Architecture", *U.S. Appl. No. 10/643,586, filed Aug. 18 2003*, 47 Pages.

Gallager, Robert, "Scale Factors for Distributed Routing Algorithm", *NTC '77 Conference Record*, vol. 2, (1977), 28:2-1-28:2-5.

Gharachorloo, Kourosh, "Two Techniques to Enhance the Performance of Memory Consistency Models", *Proceedings of the International Conference on Parallel Processing*, (1991), 1-10.

Glass, C. J., et al., "The Turn Model for Adaptive Routing", *Proceedings, 19th Interanational Symposium on Computer Architecture*, (May 1992), 278-287.

Gravano, L, et al., "Adaptive Deadlock- and Livelock-Free Routing with all Minimal Paths in Torus Networks", *IEEE Transactions on Parallel and Distributed Systems*, 5(12), (Dec. 1994), 1233-1251.

Gupta, Rajiv, et al., "High Speed Synchronization of Processors Using Fuzzy Barriers", *International Journal of Parallel Programming 19*(1), (Feb. 1990), 53-73.

Handy, J., "The Cache Memory Book", *Academic Press*, (1993), 73-84.

Ishihata, Hiroaki, et al., "Architecture of Highly Parallel AP1000 Computer", *Systems and Computers in Japan*, 24(7), (1993), 69-76.

Jesshope, C. R., et al., "High Performance Communications in Processor Networks", *Proc. 16th International Symposium on Computer Architecture*, (May 1989), pp. 150-157.

Kirkpatrick, S., et al., "Optimization by Simulated Annealing", *Science*, 220(4598), (May 13, 1983), 671-680.

Kontothanassis, L., et al., "VM-based shared memory on low-latency, remote-memory-access networks", *Proceedings of the ACM ISCA '97*, (1997), 157-169.

Linder, Daniel H., et al., "An Adaptive and Fault Tolerant Wormhole Routing Strategy for k-ary n-cubes", *IEEE Transactions on Computers*, 40(1), (1991), 2-12.

Lui, Z, et al., "Grouping Virtual Channels for Deadlock-Free Adaptive Wormhole Routing", *5th International Conference, Parallel Architectures and Languages Europe (PARLE '93)*, (Jun. 14-17, 1993), 254-265.

Nuth, Peter, et al., "The J-Machine Network", *Proceedings of the IEEE International Conference on Computer Design on VLSI in Computer & Processors*, (1992), 420-423.

O'Keefe, Matthew T., et al., "Static Barrier MIMD: Architecture and Performance Analysis", *Journal of Parallel and Distributed Computing*, 25(2), (Mar. 25, 1995), 126-132.

Patterson, D. A, et al., "", *Computer Architecture a Quantitative Approach*, 2nd Edition, Morgan Kaufmann Publishers, Inc., San Francisco,CA, (1996), 255-260 & 308-317.

Patterson, D. A., et al., "", *Computer Architecture: A Quantitative Approach*, 2nd Edition, Morgan Kaufmann Publishers, San Francisco, CA, (1996), 241-243.

Patterson, D., et al., "", *Computer Architecture: A Quantitative Approach*, Second Edition, Morgan Kaufmann Publishers Inc., (1996), 251-256.

Patterson, D. A., et al., "", *Computer Architecture: A Quantitative Approach*, 2nd Edition, Morgan Kaufmann Publishers, Inc., San Francisco, CA, (1996), 194-197.

Patterson, David A., et al., "", *Computer Architecture: A Quantitative Approach*, 2nd Edition, Morgan Kaufmann Publishers, Inc., San Francisco, CA, (1996), 699-708.

Patterson, David A., et al., "", *Computer Architecture: A Quantitative Approach*, 2nd Edition, Morgan Kaufmann Publishers, Inc., San Francisco, CA, (1996), 179-187, 373-384.

Patterson, David A., et al., "", Computer Architecture: A Quantitative Approach, 2nd Edition, Morgan Kaufmann Publishers, Inc., San Francisco, CA, (1996), 39-41.

Scott, S. L., "Decoupled Store Address and Data in a Multiprocessor System", *U.S. Appl. No. 10/643,742, filed Aug. 18, 2003*, 27 Pages.

Scott, S. L., "Latency Tolerant Distributed Shared Memory Multiprocessor Computer", *U.S. Appl. No. 10/643,585, filed Aug. 18, 2003*, 17 Pages.

Scott, S. L., et al., "Multistream Processing Memory-and Barrier-Synchronization Method and Apparatus", *U.S. Appl. No. 10/643,741, filed Aug. 18, 2003*, 143 pages.

Scott, S. L., et al., "Relaxed Memory Consistency Model", *U.S. Appl. No. 10/643,754, filed Aug. 18, 2003*, 144 Pages.

Scott, S., "Synchronization and Communication in the T3E Multiprocessor", *ASPLOS*, vol. II, (1996), pp. 26-36.

Sheets, K., et al., "Remote-Translation Mechanism for a Multinode System", *U.S. Appl. No. 10/643,758, filed Aug. 18, 2003*, 42 Pages.

Shumway, M, "Deadlock-Free Packet Networks", *Transputer Research and Applications 2, NATUG-2 Proceedings of the Second Conference of the North American Transputer Users Group*, (Oct. 18-19, 1989), 139-177.

Snyder, L., "Introduction to the Configurable, Highly Parallel Computer", *IEEE Computer 15*(1), (Jan. 1982), 47-55.

Talia, D., "Message-Routing Systems for Transputer-Based Multicomputers", *IEEE Micro*, 13(3), (Jun. 1993), 62-72.

Wang, Weilin, et al., "Trunk Congestion Control in Heterogeneous Circuit Switched Networks", *IEEE Transactions on Communications*, 40(7), (Jul. 1992), 1156-1161.

Wood, D. A., et al., "An In-Cache Address Translation Mechanism", *Proceedings of the 13th Annual International Symposium on Computer Architecture*, (1986), 358-365.

Wu, Min-You, et al., "DO and FORALL: Temporal and Spatial Control Structures", *Proceedings, Third Workshop on Compilers for Parallel Computers*, ACPC/TR, (Jul. 1992), 258-269.

Yang, C. S., et al., "Performance Evaluation of Multicast Wormhole Routing in 2D-Torus Multicomputers", *Proceedings, Fourth International Conference on Computing and Information* (ICCI '92), (1992), 173-178.

Yantchev, J., et al., "Adaptive, Low Latency, Deadlock-Free Packet Routing for Networks of Processors", *IEEE Proceedings*, 136, Part E, No. 3, (May 1989), 178-186.

US 7,243,211, 07/2007, Kohn (withdrawn)

\* cited by examiner

METHOD AND APPARATUS FOR COOLING ELECTRONIC COMPONENTS

RELATED APPLICATION

This application is a divisional under 37 C.F.R. 1.53(b) of U.S. application Ser. No. 11/075,832 filed Mar. 9, 2005, now U.S. Pat. No. 7,478,769 which application is incorporated herein by reference and made a part hereof.

FIELD OF THE INVENTION

The present invention is related to cooling of electronic equipment, and more particularly to cooling electronics components.

BACKGROUND

Demand for higher performance supercomputers continues to create challenging thermal and packaging design environments. One cooling method utilizes direct liquid cooling with dielectric fluids. Direct liquid cooling circumvents the problems of high thermal interface resistance associated with conventional technologies and is capable of providing very high heat transfer rates. One method for cooling high heat flux electronic components is spray cooling. Spray cooling is a process where a fluid is sprayed onto the surface of a heat generating component at a rate that maintains a continuously wetted surface. The fluid on the hot surface absorbs the heat thus removing the heat from the surface of the component. However, there is a need for improvements to present spray cooling systems to better tailor the cooling to the specific application.

SUMMARY

One aspect of the present invention includes a spray delivery device including one or more inlet apertures and one or more corresponding outlet apertures. The device is configured such that each pair of corresponding inlet apertures and outlet apertures forms an asymmetrical, non-uniform density, full-cone spray pattern.

One aspect provides a method including delivering a cooling fluid to a spray delivery device, and positioning an inlet aperture relative to an outlet aperture on the spray delivery device such that the cooling fluid delivered through the spray delivery device forms an asymmetrical non-uniform density full cone spray pattern.

DETAILED DESCRIPTION

In the following detailed description of the preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

Figures 1A, 1B:
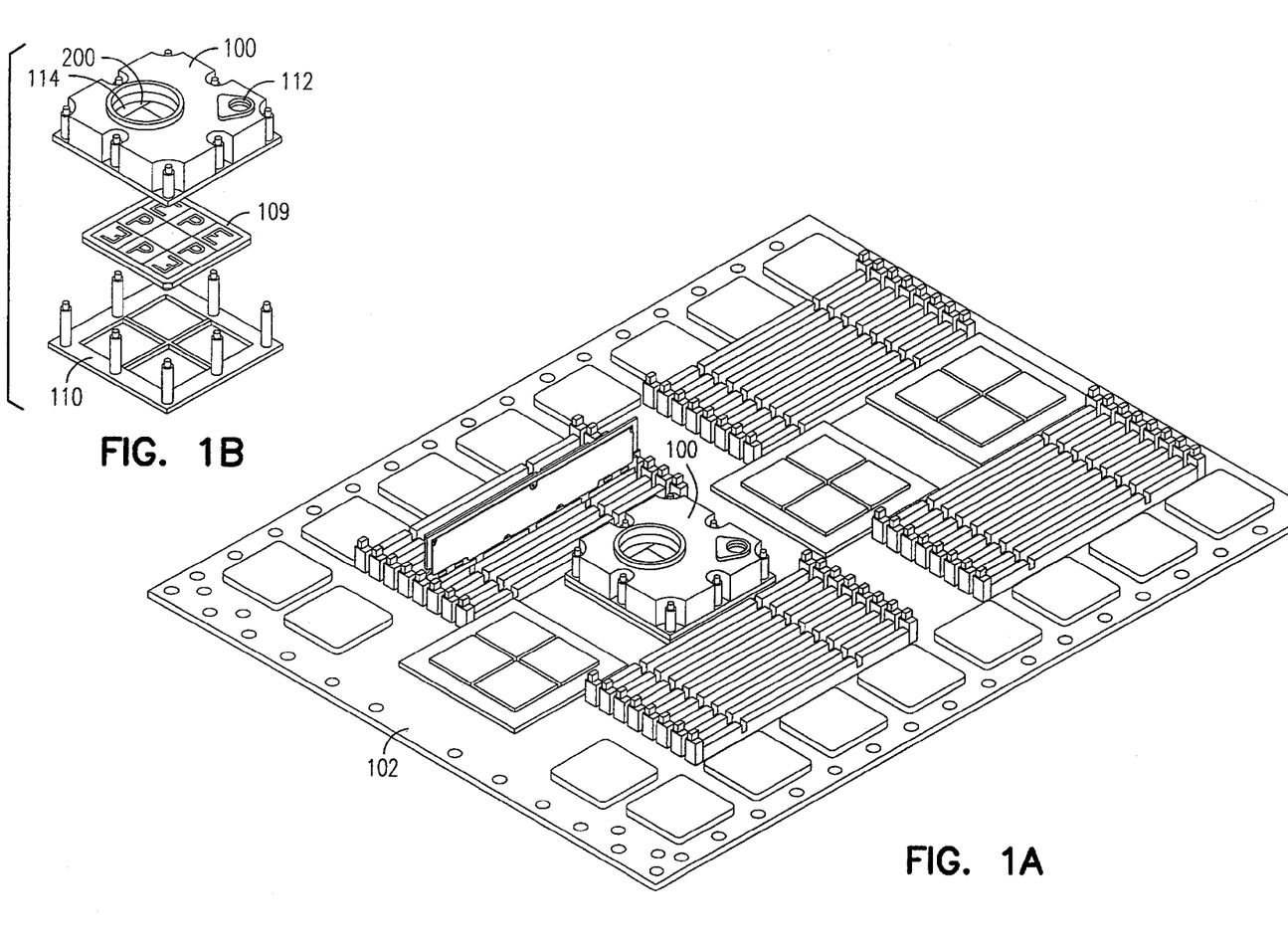
FIG. 1A illustrates a cooling cap applied over a circuit board, in accordance with one embodiment.
FIG. 1B shows an exploded view of the cooling cap assembly of FIG. 1A.

FIGS. 1A and 1B illustrate a spray cooling cap 100 mounted to a circuit board 102, in accordance with one embodiment. Mounted beneath cooling cap 100 are high power electrical components 109. Cooling cap 100 delivers a cooling spray to at least some of the components 109 on the circuit board. In one embodiment, cooling cap 100 is applied over heat generating components, such as electrical components 109, and mounted to the circuit board using a frame 110. Other configurations could be used as well. Cooling cap 100 includes a fluid input 112 and a fluid output 114 for injecting and removing liquid, respectively, from the cooling cap. For example, after the coolant is sprayed onto the integrated circuits it exits cooling cap 100 through output 114.

In one embodiment, the cooling fluid can include 3M's dielectric fluorocarbon, FC72. Its boiling temperature is 56 degrees C. at 1 atmosphere pressure. In some embodiments, other dielectric fluids are used. In one embodiment, water is used as a cooling fluid. Cooling cap 100 includes a spray delivery device, such as a spray plate 200, which directs a cooling spray towards the heat generating components 109.

Figure 2A:
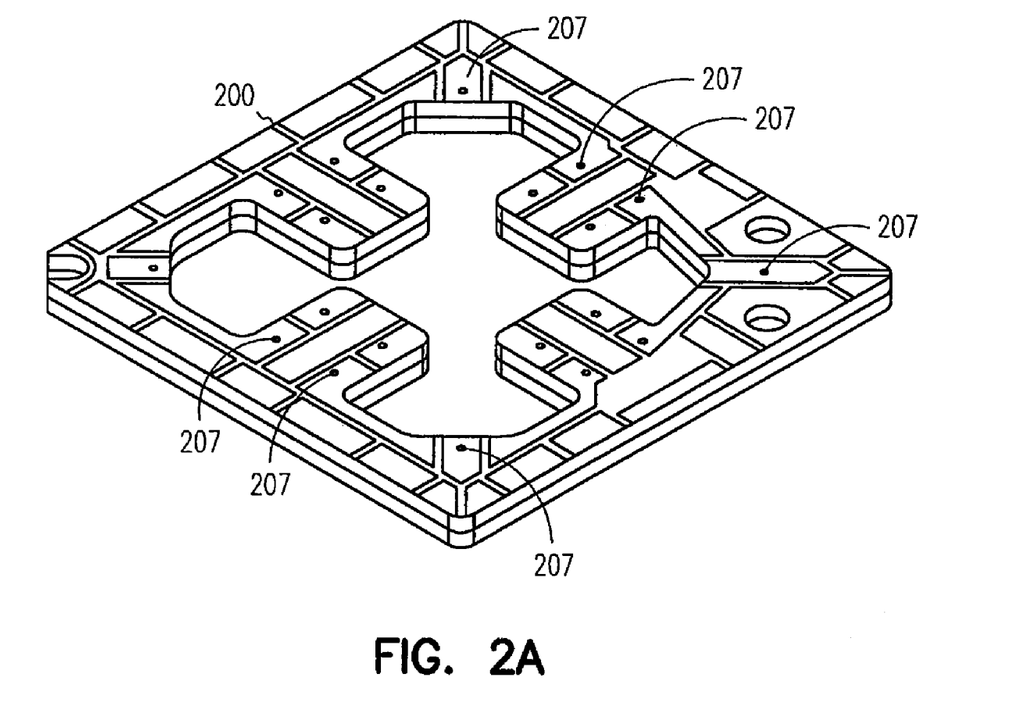
FIG. 2A illustrates a cooling spray delivery device of the cooling cap of FIG. 1, in accordance with one embodiment.

FIG. 2A illustrates a bottom perspective view of spray delivery device or spray plate 200 in accordance with one embodiment. Spray plate 200 includes one or more nozzles 207 that deliver a coolant to a specific location. In one embodiment, the nozzles are configured to deliver a full-cone, non-uniform density spray pattern. As will be discussed below, this allows a designer to tailor the cooling characteristics of the spray delivery device.

Figure 2B:
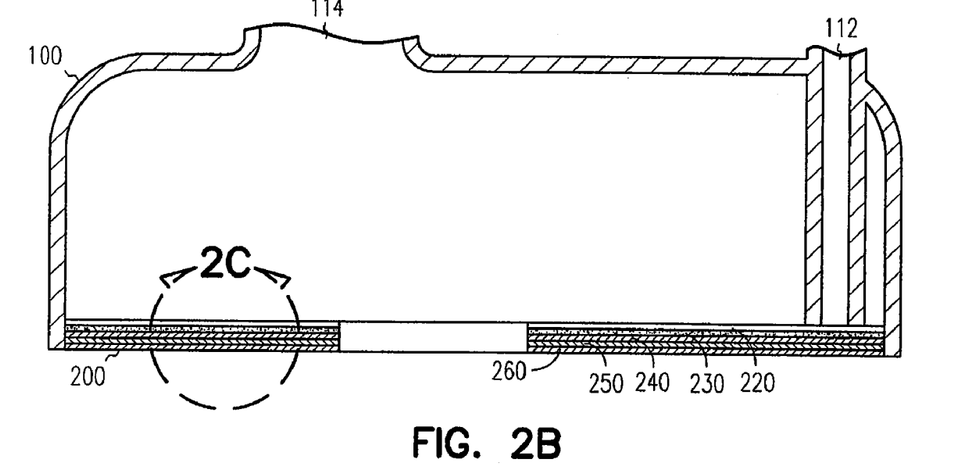
FIG. 2B illustrates a side section view of the spray delivery device of FIG. 2A.
Figure 2C:
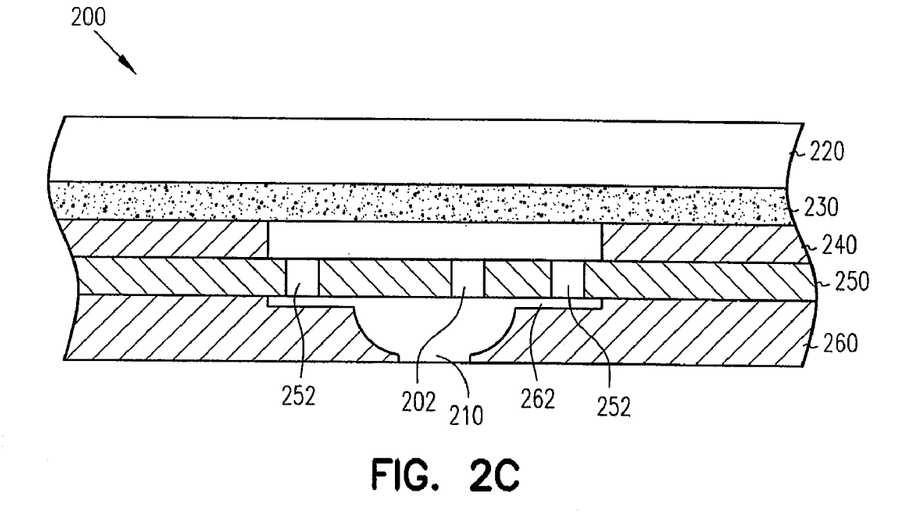
FIG. 2C illustrates a section view of the spray delivery device of FIG. 2B.

FIG. 2B shows a schematic illustration of a section view of spray plate 200 of cooling cap 100 in accordance with one embodiment. FIG. 2C shows further details of the spray plate. In one embodiment, the spray plate is an integral unit formed of a single plate having the inlets and outlets formed therein. In other embodiments, spray plate 200 can be formed of a series of laminated layers. For example, some embodiments include an inlet plate layer 220 to receive cooling fluid from input 112 of the cooling cap. Some embodiments include a strainer layer 230 between the inlet plate layer 220 and an adapter plate layer 240. Strainer layer 230 can strain impurities from the cooling fluid. The adapter plate layer 240 delivers cooling fluid to an inlet aperture plate layer 250. Coolant exits through outlets 210 in an outlet aperture plate layer 260.

In one embodiment, inlet aperture plate 250 includes inlet aperture(s) 202 and outlet plate 260 includes outlet aperture(s) 210. As will be discussed in further detail below, inlet apertures 202 are positioned in a non-aligned, offset manner over the corresponding outlet apertures 210 so as to deliver a radially asymmetric, non-uniform density spray pattern to a surface.

In one embodiment, spray plate 200 can include a swirler 262 adjacent each outlet aperture 210 and plate 250 can include a plurality of swirler inlet apertures 252 to deliver cooling fluid to the swirler 262. In some embodiments, swirler 262 can be formed directly in outlet aperture plate 260 or can be configured as a separate laminated plate. Swirlers 262 are radially extending from aperture 210 and after being fed cooling liquid the swirlers tangentially project the liquid into the swirl chamber.

In various embodiments, apertures 202, 252, 210 can be formed in the plates by chemical etching or machining. The walls of the apertures can be straight or bowl shaped. In some embodiments, the plates can be made of stainless steel. In one embodiment, each plate includes a thickness of about 0.013 inches.

In various embodiments, the inlet apertures can be about 0.009 inches in diameter, about 0.0083 inches in diameter with the outlet aperture about 0.0115 inches in diameter, or about 0.0112 inches in diameter. In some embodiments, the inlet apertures can be about 0.0113 inches in diameter or about 0.0102 inches in diameter. The outlet apertures can be about 0.0139 or about 0.0136 inches in diameter. The sizes can range between the sizes discussed above and can be larger or smaller in some embodiments. The ratio between the inlet/outlet apertures can be between 0.70 to about 0.85. In some examples the ratio is about 0.74 to 0.75.

Figure 3:
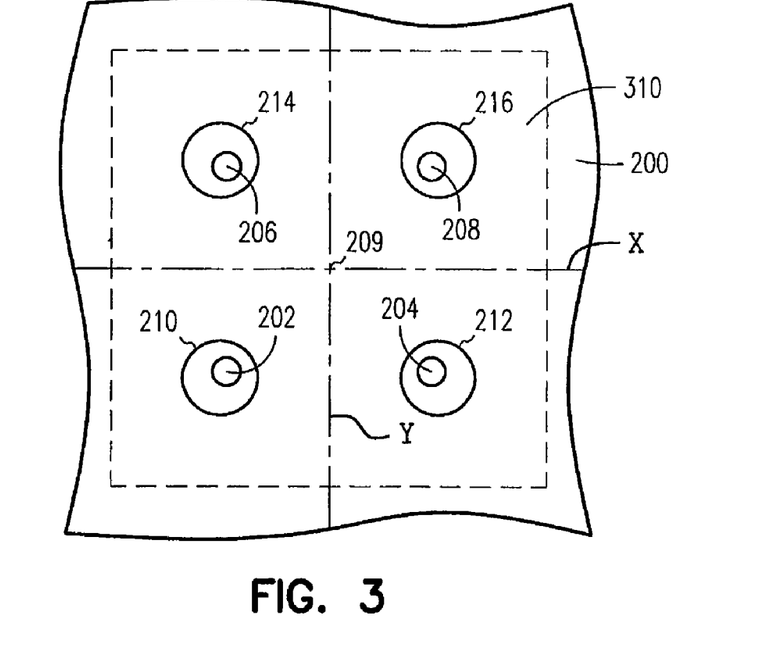
FIG. 3 illustrates a schematic top view of a portion of the spray delivery device of FIG. 2B.
Figure 4:
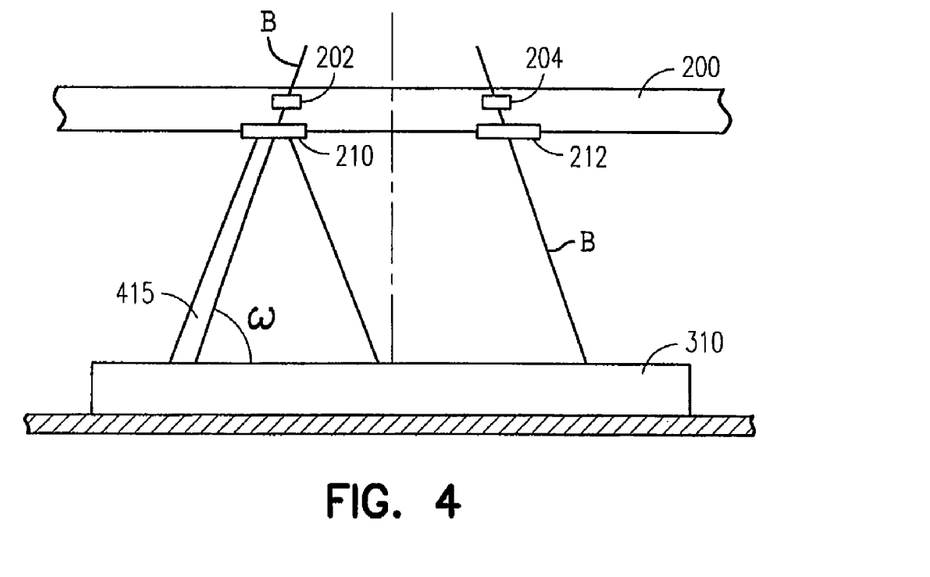
FIG. 4 illustrates a schematic cross-section side view of a portion of the spray delivery device of FIG. 2B.

FIGS. 3 and 4 illustrate a schematic top view and schematic side view of a portion of spray plate 200, in accordance with one embodiment. Again, spray plate 200 is adapted to deliver a radially asymmetric, non-uniform density spray pattern onto a surface of a heat generating component 310.

Referring to FIG. 4, spray plate 200 generally includes a plurality of inlet apertures 202, 204 and a plurality of corresponding outlet apertures 210, 212. In this embodiment, each pair of corresponding inlet apertures and outlet apertures (e.g. inlet aperture 202 and outlet aperture 210 are a pair of corresponding inlet and outlet apertures), are configured to form an asymmetric density full-cone spray pattern when a cooling liquid is delivered to the spray plate.

The fluid inlet apertures 202, 204 are located over a corresponding outlet aperture 210, 212, respectively to deliver fluid to the respective outlet aperture such that the cooling fluid has a full cone spray pattern 415. Full cone spray pattern 415 means that the spray pattern forms an exterior cone shape and the interior of the cone includes spray (i.e. it is not a hollow cone). However, the inlet apertures are non-centered and are offset over the outlet apertures such that the full cone spray has a spray pattern having a non-uniform and asymmetric density distribution as it strikes the surface. Thus, the center of inlet aperture 202, for example, is not directly aligned with or centered over the center of outlet aperture 210. This results in an axis of alignment B, and an angle of alignment w, illustrated in FIG. 4. This off-center positioning changes the density distribution of the full cone spray, placing a higher density towards a predetermined area of the spray cone as the spray hits a surface. The angle of alignment, ω, can be between about 45 degrees and about 89 degrees, for example, in various embodiments. In some embodiments, the angle can be between about 65 degrees and about 85 degrees. In some embodiments, the angle can be between about 75 degrees to about 85 degrees. In one embodiment, the angle is about 80 degrees. The angle can be varied according to the distance from the outlet to the surface being cooled and also the amount of heat being dissipated on the die surface.

Referring to FIG. 3, in one example spray plate 200 includes at least four fluid inlet apertures 202, 204, 206, and 208 having a center point 209 therebetween. In this example, the four apertures 202-208 deliver cooling fluid to a single heat producing component 310. In this example, each of the four fluid inlet apertures 202-208 is located closer to the center point 209 relative to that fluid inlet aperture's corresponding outlet aperture 210, 212, 214, and 216, respectively. In one embodiment, the inlet aperture is offset from the center of the outlet aperture in the direction of the center line of the nozzle array. In other words, the inlet apertures are positioned towards the intersection of the central lines of symmetry X and Y. This results in the fluid from the inlet apertures being directed more towards the corners of the surface of component 310. With more spray being directed to the outside corners, less flow is involved in the interference zone for the cones. For this reason the overall flow is more evenly distributed over the surface being cooled. This allows for a higher amount of overall flow and a higher heat flux and cooling capacity. For example, about a 25%-50% increase in cooling fluid flow can be realized when using the asymmetric non-uniform, spray cone patterns discussed herein. By offsetting the inlet aperture, a designer is able to change the pattern of the atomized droplets in the cone. The density of the spray cone becomes non-uniform throughout the spray cone when the spray hits the surface.

Figure 5:
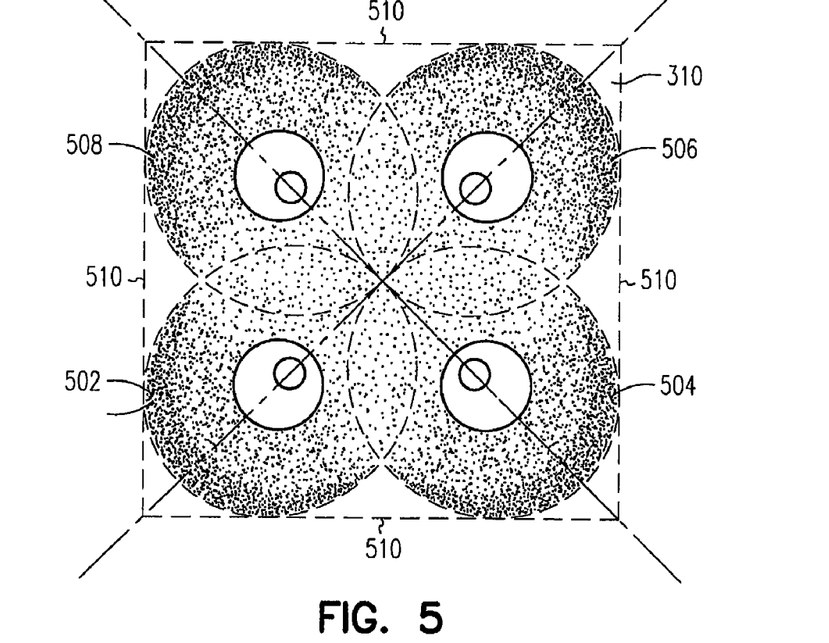
FIG. 5 shows a spray pattern of a spray delivery device according to one embodiment.

FIG. 5 shows a top view of a spray pattern of four overlapping spray cones 502, 504, 506, and 508 of a spray delivery device according to one embodiment. As illustrated, the darker portion of each cone has a higher concentration of droplets than the lighter portion of the cone. This pattern directs a higher density of cooling fluid towards the outside perimeter surface area 510 of component 310 being cooled. This allows for better distribution of the cooling fluid. For example, the illustrated spray pattern minimizes interference with the other overlapping cones. Also, by the adjustment of the alignment of the inlet apertures relative to the outlet aperture, the designer can control the spray pattern density of the cones.

In other embodiments, the pattern of the overlapping (or non-overlapping) cones can be tailored as desired. This structure increases the maximum heat flux at the burnout point of the design. It accomplishes this by minimizing the amount of fluid from each cone that interferes with the other three cones on each IC and collects in the middle of the dies.

Figure 6:
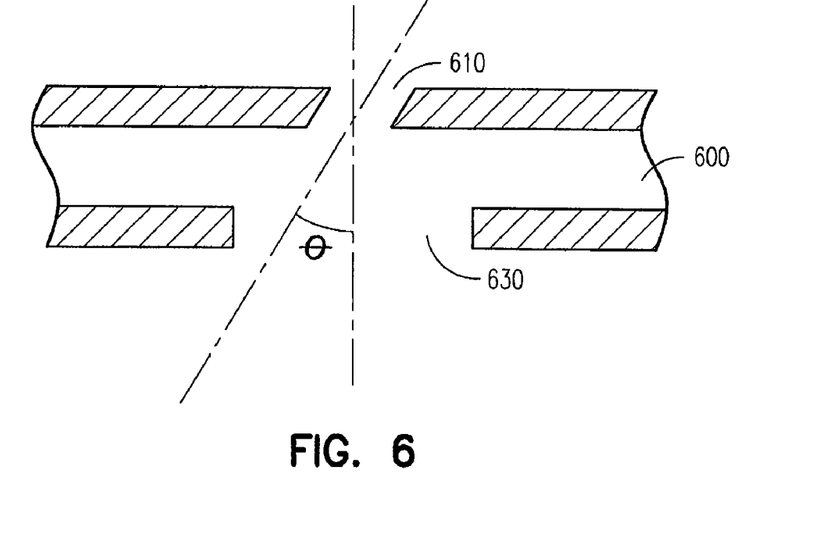
FIG. 6 shows a cross-section side view of a portion of a spray delivery device in accordance with one embodiment.

FIG. 6 shows a cross-section side view of a portion of a spray delivery device 600 in accordance with one embodiment. Details of device 600 are similar to device 200 described above and will not be discussed for sake of brevity. In this example, an inlet aperture 610 is generally centered over an outlet aperture 630. However, the center aperture includes an angled configuration defining an angle θ relative to the vertical orientation of the outlet aperture. Again, this delivers a full-cone spray having an asymmetrical non-uniform density spray pattern when it hits a surface. Angle θ can vary depending on the cooling needs. In some examples, it can be about 1 degree to about 85 degrees; it can be about 20 degrees to about 80 degrees; it can be about 45 degrees to about 80 degrees; it can be about 75 degrees to about 85 degrees.

In one example use, a cooling system can be designed as discussed above to include a cooling cap 100 having a spray plate 200 or a spray plate 600. The cooling cap is mounted over one or more heat generating components. A cooling fluid is delivered to the spray plate. The spray plate is configured to cool a heat generating component by delivering two or more overlapping full-cone sprays at a surface of the heat generating component, wherein each of the overlapping full-cone sprays includes a non-uniform density such that the overlapping portion of the spray cones has a lower spray density than the non-overlapping portions.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A method comprising cooling a heat generating component by delivering two or more overlapping full-cone sprays at a surface of the heat generating component, wherein each of the overlapping full-cone sprays includes a non-uniform density such that the overlapping portion of each of the spray cones has a lower spray density than the non-overlapping portions of each of the spray cones.

2. The method of claim 1, wherein the method includes delivering four overlapping full-cone sprays, each having a non-uniform density.

3. The method of claim 1, including providing a plurality of inlet apertures and a plurality of corresponding outlet apertures, each inlet aperture being located over its corresponding outlet aperture such that the inlet aperture is non-centered over the outlet aperture.

4. The method of claim 1, wherein the delivering two or more overlapping spray cones includes providing a spray delivery device having two or more fluid inlet apertures to deliver a cooling fluid towards two or more corresponding outlet apertures.

5. The method of claim 4, wherein at least one of the fluid inlet apertures are offset from its corresponding outlet aperture.

6. The method of claim 5, wherein the spray delivery device includes at least four fluid inlet apertures having a center point therebetween and wherein each of the four fluid inlet apertures is located closer to the center point relative to that fluid inlet aperture's corresponding offset outlet aperture.

7. The method of claim 4, wherein the spray delivery device includes a laminated plate structure including a first plate having the two or more fluid inlet apertures and a second plate having the two or more corresponding outlet apertures.

8. The method of claim 7, wherein the second plate includes a swirler adjacent each outlet aperture and the first plate includes a plurality of swirler inlet apertures to deliver cooling fluid to the swirler.

9. The method of claim 1, wherein the full-cone sprays are formed from a dielectric cooling fluid.

10. A method comprising cooling a heat generating component by delivering at least four overlapping full-cone sprays at a surface of the heat generating component, wherein each of the overlapping full-cone sprays includes an asymmetrical non-uniform density such that the overlapping portion of each of the spray cones has a lower spray density than the non-overlapping portions of each of the spray cones, and wherein each of the spray cones are formed by positioning an inlet aperture relative to an outlet aperture on a spray delivery device, wherein at least four of the fluid inlet apertures have a center point therebetween and wherein each of the four fluid inlet apertures is located closer to the center point relative to that fluid inlet aperture's corresponding outlet aperture.

11. The method of claim 10, wherein each inlet aperture is located over its corresponding outlet aperture such that the inlet aperture is non-centered over the outlet aperture.

12. The method of claim 10, wherein the inlet and outlet apertures are formed by a laminated plate structure including a first plate having the fluid inlet apertures and a second plate having the corresponding outlet apertures.

13. The method of claim 12, wherein the second plate includes a swirler adjacent each outlet aperture and the first plate includes a plurality of swirler inlet apertures to deliver cooling fluid to the swirler.

14. The method of claim 10, wherein the full-cone sprays are formed from a dielectric cooling fluid.

* * * * *